United States Patent [19]

Park

[11] Patent Number: 5,704,033

[45] Date of Patent: Dec. 30, 1997

[54] APPARATUS AND METHOD FOR TESTING A PROGRAM MEMORY FOR A ONE-CHIP MICROCOMPUTER

[75] Inventor: Young Seung Park, Daeku-si, Rep. of Korea

[73] Assignee: LG Semicon Co., LTD., Chungcheongbuk-Do, Rep. of Korea

[21] Appl. No.: 540,169

[22] Filed: Oct. 6, 1995

[30] Foreign Application Priority Data

Oct. 7, 1994 [KR] Rep. of Korea ............... 25719-1994

[51] Int. Cl.$^6$ .................... G06F 11/27; G06F 11/277
[52] U.S. Cl. .................... 395/183.06; 371/21.1
[58] Field of Search .................... 395/183.06, 183.08, 395/183.1, 183.18, 183.01, 183.16, 183.19, 183.2, 183.21, 183.03, 185.02; 371/21.5, 21.1, 21.2

[56] References Cited

U.S. PATENT DOCUMENTS

| Re. 33,461 | 11/1990 | Splett et al. ............... 371/25.1 |
| --- | --- | --- |
| 3,387,276 | 6/1968 | Reichow ............... 371/21.1 |
| 4,165,533 | 8/1979 | Jonsson ............... 395/185.06 |
| 4,414,665 | 11/1983 | Kimura et al. ............... 371/21.2 |
| 4,485,435 | 11/1984 | Sibley ............... 395/421.01 |
| 4,644,541 | 2/1987 | Linkowski ............... 395/185.02 |
| 4,686,456 | 8/1987 | Furuyama et al. ............... 371/21.5 |
| 4,967,387 | 10/1990 | Shibasaki et al. ............... 395/183.06 |
| 4,996,659 | 2/1991 | Yamaguchi et al. ............... 364/579 |
| 5,142,688 | 8/1992 | Harwood, III ............... 395/183.06 |
| 5,146,459 | 9/1992 | Shimizu ............... 371/21.5 |
| 5,173,903 | 12/1992 | Zelley et al. ............... 395/183.06 |
| 5,191,585 | 3/1993 | Velazquez ............... 371/53 |
| 5,271,015 | 12/1993 | Akiyama ............... 371/21.5 |
| 5,475,815 | 12/1995 | Byers et al. ............... 395/183.08 |
| 5,497,350 | 3/1996 | Muhmenthaler et al. ............... 365/201 |
| 5,530,804 | 6/1996 | Edgington et al. ............... 395/183.06 |
| 5,535,164 | 7/1996 | Adams et al. ............... 371/21.1 |
| 5,548,713 | 8/1996 | Petry et al. ............... 395/183.03 |

*Primary Examiner*—Robert W. Beausoliel, Jr.
*Assistant Examiner*—Scott T. Baderman
*Attorney, Agent, or Firm*—Birch, Stewart, Kolasch & Birch, LLP

[57] ABSTRACT

In an apparatus of testing a program memory for a one-chip microcomputer which allows the test of program memory mounted within the microcomputer and the test of another function block, thereby reducing test time, and the method therefor, the testing apparatus includes a central processing unit (CPU) for controlling the overall system, an interrupt controller for controlling an interrupt function, a data memory for storing information on data, a peripheral unit connected to a main system for performing input and output functions, a program memory for storing each program information having a predetermined pattern, an address counter for setting address of program memory via an address bus line switched by a first switch, a check-sum calculator for calculating and storing the entire data of the set address of program memory via a data bus line switched by a second switch, a test mode switch for controlling first and second switches, and address counter, and an input/output port for inputting or outputting port outputs of the entire data of check-sum calculator and data of the overall system. Tests for various functional blocks except the program memory are simultaneously performed while performing a test for the program memory. Therefore, the test time and the test cost due to large program memories can be reduced.

16 Claims, 3 Drawing Sheets

APPARATUS AND METHOD FOR TESTING A PROGRAM MEMORY FOR A ONE-CHIP MICROCOMPUTER

BACKGROUND OF THE INVENTION

The present invention relates to a one-chip microcomputer, and more particularly, to a one-chip microcomputer which allows the testing of the program memory mounted within the microcomputer and the testing of other functional blocks simultaneously, thereby reducing test time and test cost.

Hereinbelow, testing of a program memory for a conventional one-chip microcomputer will be described with reference to the accompanying drawings.

FIG. 1 is a block diagram of a conventional one-chip microcomputer, and FIG. 2 is a flowchart showing a method for testing the conventional one-chip microcomputer.

First, as shown in FIG. 1, the conventional one-chip microcomputer includes an interrupt controller 1, a central processing unit (CPU) 2, a data memory 3, a program memory 4, a peripheral unit 5, an input/output port 6, and other functional blocks are connected structurally and functionally with one another through an address bus line 7 and a data bus line 8.

The conventional one-chip microcomputer constructed as above performs a test for determining whether or not the microcomputer is in good condition.

In testing, data are applied to the appropriate functional blocks through the input/output port 6 and data bus line 8, and are read out to input/output port 6. Then it is determined whether or not the results match expected values.

Different program data are coded in the program memory 4 according to usage. Then, it is tested whether or not pertinent information is coded in the program memory 4.

The conventional testing method for the aforementioned program memory will now be described with reference to FIG. 2.

First, the address of program memory 4 is set to address φ, data at address φ of program memory 4 is output to the input/output port 6, and it is checked whether the output data is identical to the expected value. If the output data does not match the expected value, it is determined that the one-chip microcomputer may be defective.

If the output data is identical the expected value, however the present address of the program memory 4 is increased by 1. These tests are continued until last address is reached. If there is no abnormality, the one chip microcomputer is determined to be in good condition and the test is terminated.

However, in the testing apparatus of program memory for the conventional one-chip microcomputer, other functional units of the one-chip microcomputer cannot be tested while the program memory is being tested. Due to the current demand on high-function, large program memories, the conventional testing apparatus and method require increased testing time and increased testing cost.

SUMMARY OF THE INVENTION

To solve the above and other problems of the prior art, it is an object of the present invention to provide an effective testing apparatus and method for a program memory to a one-chip microprocessor, which can simultaneously perform test on the program memory and on other various units of the processor, thereby reducing test time and cost.

To accomplish the above and other objects, there is provided a testing apparatus for a program memory of a one-chip microcomputer according to the present invention comprising: a central processing unit (CPU) for controlling the overall system; an interrupt controller for controlling an interrupt function; a data memory for storing information and data; a peripheral unit connected to a main system for performing input and output functions; a program memory for storing each program information having a predetermined pattern; address counting means for setting an address of the program memory via an address bus line switched by a first switch; check-sum calculating means for calculating and storing the entire data of the set address of the program memory via a data bus line switched by a second switch; a test mode switch for controlling the first and second switches and the address counting means; and an input/output port for inputting or outputting the entire data of the check-sum calculating means and data of the overall system.

Also, there is provided a method for testing a program memory for a one-chip microcomputer according to the present invention comprising the steps of: switching into a test mode and check-summing all address data of a program memory (step 1); performing tests on other functional units except the program memory block simultaneously with the step 1 (step 2); and checking termination of the step 2, comparing the check-summed data with an expected value and determining whether the one-chip microcomputer is in good or poor condition according to the comparison result (step 3).

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF PREFERRED EMBODIMENTS

Figure 1:
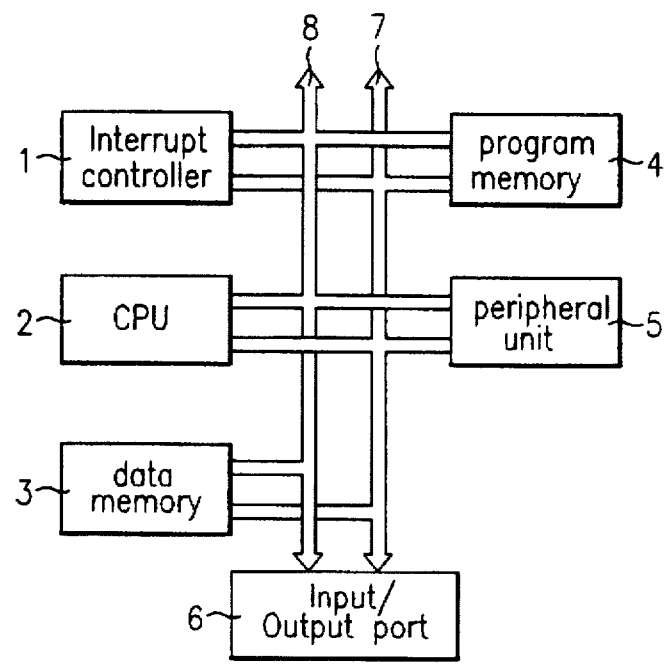
FIG. 1 is a block diagram of a conventional one-chip microcomputer.
Figure 2:
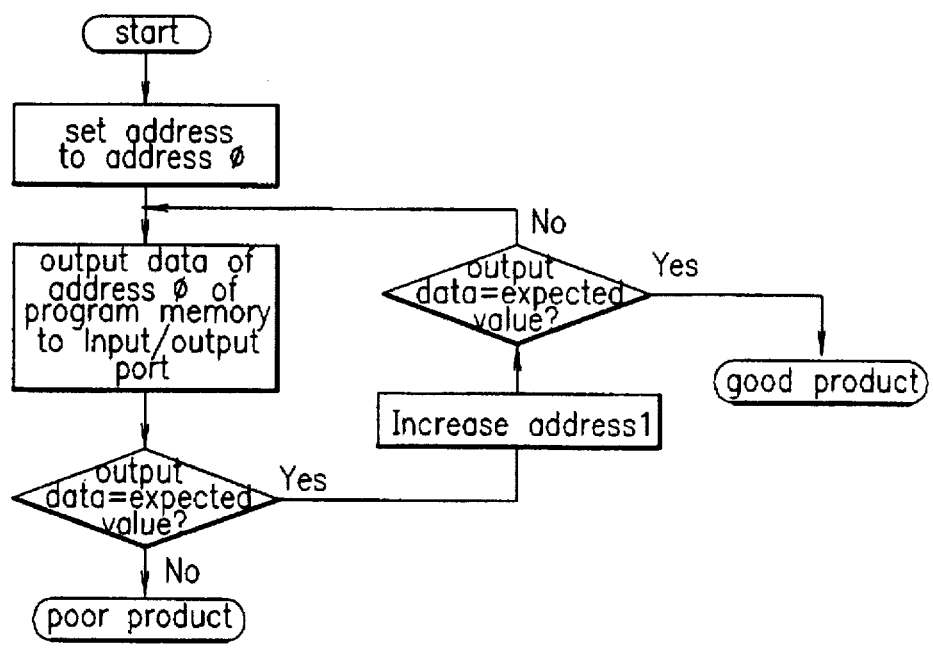
FIG. 2 is a flowchart showing a conventional method for testing a program memory.
Figure 3:
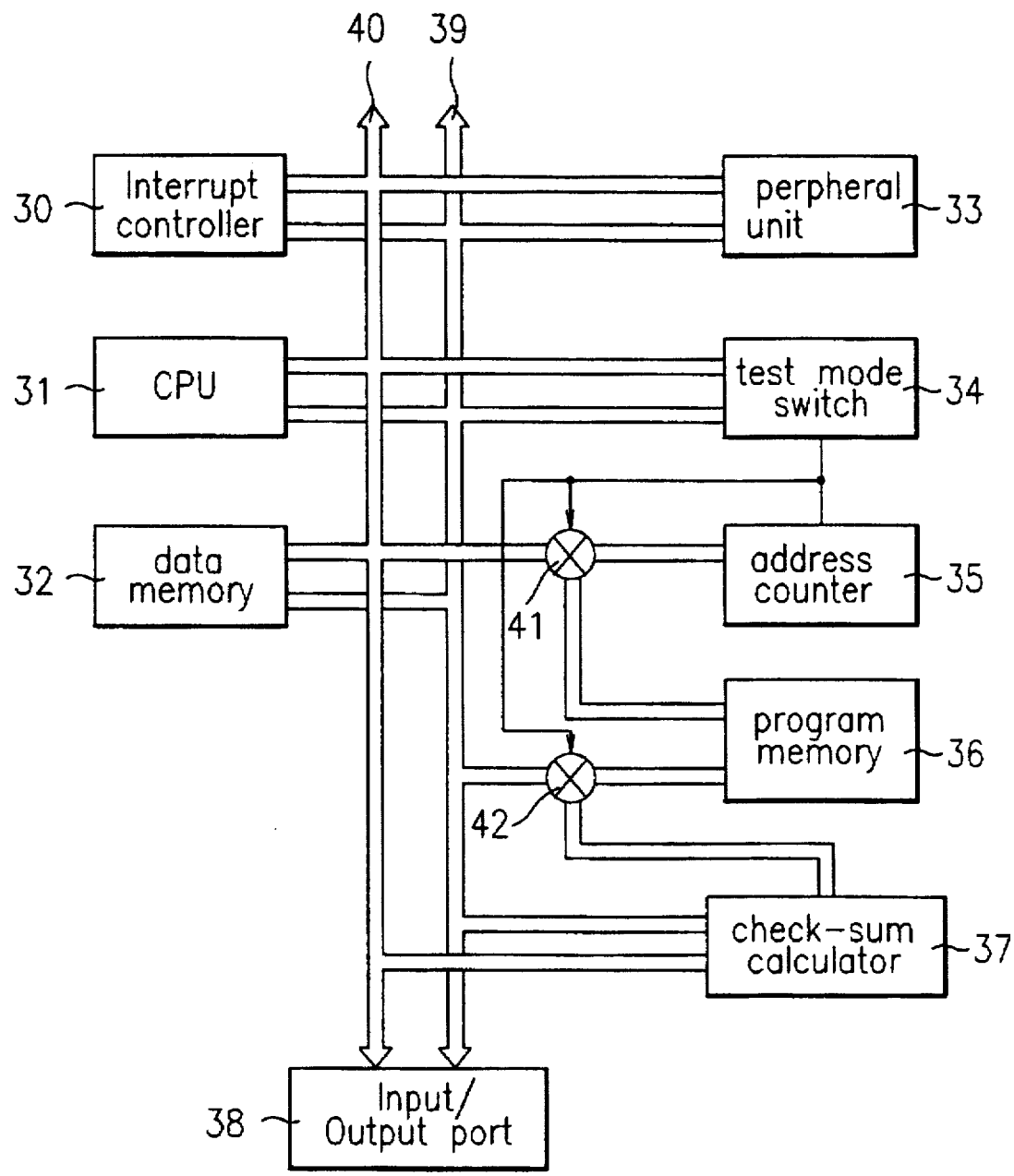
FIG. 3 is a block diagram of a one-chip microcomputer according to the embodiments of the present invention.

As shown in FIG. 3, a testing apparatus for a program memory of a one-chip microcomputer according to the present invention includes an interrupt controller 30 for controlling an interrupt function, a central processing unit (CPU) 31 for controlling the overall system, a data memory 32 for storing information and data, a peripheral unit 33 connected to a main system for performing input and output functions, a program memory 36 for storing program information, an address counter 35 for setting an address of the program memory 36 via an address bus line 40 switched by a first switch 41, a check-sum calculator 37 for storing the entire data of the set address of program memory 36 via a data bus line 39 switched by a second switch 42 and calculating a check-sum value of the stored data, a test mode switch 34 for controlling the first and second switches 41 and 42 and address counter 35, and an input/output port 38 for inputting and outputting the data of check-sum calculator 37 and data of the overall system.

As shown in FIG. 3, different units of the apparatus are mutually connected structurally and functionally via the address bus line 40 and data bus line 39.

Figure 4:
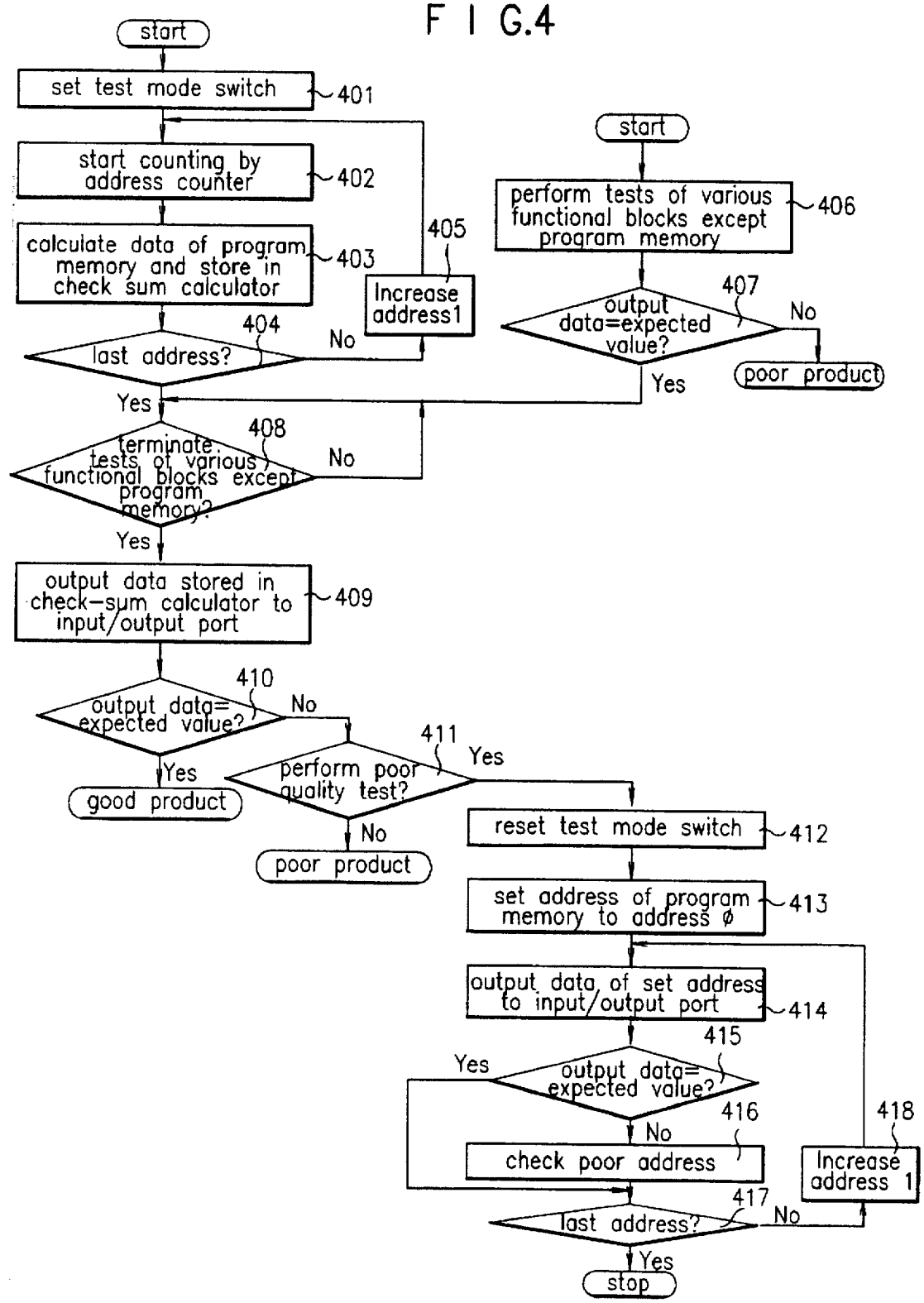
FIG. 4 is a flowchart for explaining a method for testing a program memory according to the embodiments of the present invention.

The operation of the testing apparatus for the program memory of one-chip microcomputer according to the present invention, having the aforementioned construction, will now be described with reference to FIG. 4.

Data is applied through the input/output port 38 and the test mode switch 34 for activating the test is set (step 401).

Then, an output of the test mode switch 34 enables the address counter 35, and first switch 41 is controlled so that the address counter 35 and the program memory 36 are connected through the address bus line 40. The second switch 42 is controlled so that the program memory 36 and the input port of check-sum calculator 37 are connected through the data bus line 39. The address counter 35 enabled by the test mode switch 34 then increases the set address by one starting from address ϕ and starts to count up (step 402).

The counted value sets an address of program memory 36 and the check-sum value of the data of set addresses are sequentially calculated by the check-sum calculator 37 to be stored (steps 403, 404 and 405).

At the time of testing the program memory, other units are tested simultaneously (steps 406 and 407).

If the tests for other units are terminated (step 408), the entire data of check-sum calculator 37 are output through the input/output port 38 (step 409), and compared with expected values based on the comparison result, it is determined whether the one-chip microcomputer is a good or poor product (step 410).

If the comparison result is determined to be poor, an analysis test for searching for a poor address is performed based on the user's option (step 411).

To begin the analysis test, test the mode switch 34 is reset (step 412), address of program memory 36 is set to address ϕ (step 413), and the data of program memory 36 are sequentially output through the input/output port 38. The output data of program memory 36 compared with expected values (step 415) and any poor addresses are detected based on the comparison result (steps 416, 417 and 418).

As described above, the testing apparatus and method for a program memory of a one-chip microcomputer according to the present invention, simultaneously performs tests on other various functional blocks, while performing a test on the program memory, thereby preventing increase in test time and reducing test cost in accordance with the current demand for large program memories.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for testing a program memory of a microcomputer, the microcomputer including a central processing unit, an interrupt controller for controlling an interrupt function, a data memory for storing information and data, a peripheral unit for performing input and output functions, an address bus line, a data bus line, and an input/output port for inputting and outputting data, the apparatus comprising:

a program memory for storing information therein;

address counting means for setting an address of said program memory and incrementing the set address by a predetermined value;

a first switch for selectively connecting said address counting means, said program memory, and the address bus line;

a second switch for selectively connecting said program memory, the data bus line, and check-sum calculator means;

the check-sum calculator means for calculating a check-sum value of data stored in the addresses of said program memory set and incremented by said address counting means;

mode setting means for setting a test mode and enabling said address counting means, said first switch, and said second switch when the test mode is set; and test means for performing tests on other units of the microcomputer while said check-sum calculator means calculates the check-sum value.

2. An apparatus of claim 1, wherein the predetermined value is one and said address counting means stops incrementing once a last address of said program memory is detected.

3. An apparatus of claim 1, wherein said check-sum calculator means outputs the check-sum value through the input/output port, after said test means perform the tests on the other units of the microcomputer.

4. An apparatus of claim 3, wherein the check-sum value is compared with an expected value to determine whether the microcomputer is in a predetermined condition.

5. An apparatus of claim 4, wherein based on the comparison result, an analysis test on the addresses of said program memory is performed.

6. An apparatus of claim 5, wherein the analysis test is a user's option.

7. An apparatus of claim 1, wherein the check-sum value is compared with an expected value to determine whether the microcomputer is in a predetermined condition, said mode setting means resetting the test mode and said address counting means resetting the address of said program memory, based on the comparison result, so as to perform an analysis test on the addresses of said program memory.

8. A method for testing a program memory of a microcomputer, the microcomputer including a central processing unit, an interrupt controller for controlling an interrupt function, a data memory for storing data, a peripheral unit for performing input and output functions, a program memory for storing information therein, an address bus line, a data bus line, and an input/output port for inputting and outputting data, the method comprising the steps of:

setting an address of the program memory and incrementing the set address by a predetermined value, using an address counting circuit;

providing a first switch for selectively connecting the address counting circuit, the program memory, and the address bus line;

providing a second switch for selectively connecting the program memory, the data bus line, and a check-sum calculating circuit;

calculating by using the check-sum calculating circuit a check-sum value of data stored in the addresses of the program memory set and incremented by the address counting circuit;

setting a test mode and enabling the address counting circuit, the first switch, and the second switch when the test mode is set; and performing tests on other units of the microcomputer during said calculating step.

9. A method of claim 8, wherein the predetermined value is one, and the address counting circuit stops performing said incrementing step once a last address of the program memory is detected.

10. A method of claim 8, wherein the check-sum calculating outputs the check-sum value through the input/output port, after said performing step.

11. A method of claim 10, further comprising the steps of:

comparing the check-sum value with an expected value; and determining whether the microcomputer is in a predetermined condition based on the comparison result.

12. A method of claim 11, further comprising the step of:

performing an analysis test on addresses of the program memory based on the comparison result.

13. A method of claim 12, wherein the analysis test is a user's option.

14. A method of claim 8, further comprising the steps of:

comparing the check-sum value with an expected value; and resetting a test mode and an address of the program memory based on the comparison result.

15. A method of claim 14, further comprising the step of:

performing an analysis test on the addresses of the program memory after said resetting step.

16. A method of claim 15, wherein said step of performing the analysis test includes the steps of:

sequentially outputting data of the program memory stored in the addresses of the program memory, comparing the output data with predetermined values, and detecting defects in the addresses of the program memory based on the comparison result.

* * * * *